United States Patent
Gupta et al.

(10) Patent No.: US 10,042,396 B1
(45) Date of Patent: Aug. 7, 2018

(54) CONFIGURABLE MODULE GUIDES FOR MODULAR ELECTRONIC SYSTEM

(71) Applicant: CISCO TECHNOLOGY, INC., San Jose, CA (US)

(72) Inventors: Rohit Dev Gupta, Bangalore (IN); Prashanth Pavithran, Bengaluru (IN); Viktor Brauer, Nuremberg (DE)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/679,763

(22) Filed: Aug. 17, 2017

(51) Int. Cl.
*H05K 7/14* (2006.01)
*G06F 1/18* (2006.01)
*G05B 19/042* (2006.01)

(52) U.S. Cl.
CPC ......... *G06F 1/181* (2013.01); *G05B 19/0421* (2013.01); *H05K 7/1418* (2013.01); *H05K 7/1427* (2013.01)

(58) Field of Classification Search
None
See application file for complete search history.

(56) References Cited

U.S. PATENT DOCUMENTS

| | | | | |
|---|---|---|---|---|
| 3,465,891 A | * | 9/1969 | De Rose | H02B 1/00 211/162 |
| 4,779,744 A | * | 10/1988 | Shely | H05K 7/1418 211/41.17 |
| 5,696,668 A | * | 12/1997 | Zenitani | H05K 7/1418 361/741 |
| 6,008,995 A | * | 12/1999 | Pusateri | G06F 1/184 361/752 |
| 6,309,237 B1 | * | 10/2001 | Longueville | H05K 7/1418 439/267 |
| 7,099,160 B1 | * | 8/2006 | Ice | G06F 1/185 211/41.17 |
| 7,108,559 B2 | | 9/2006 | Shtargot et al. | |
| 7,224,588 B2 | | 5/2007 | Nieman et al. | |
| 7,277,296 B2 | | 10/2007 | Ice | |
| 8,047,383 B2 | * | 11/2011 | Hendrix | H05K 7/1425 211/26 |
| 8,054,619 B1 | * | 11/2011 | Antosh | H05K 7/1418 361/679.31 |
| 8,184,442 B2 | * | 5/2012 | Fujimura | H05K 7/1418 361/756 |
| 8,582,299 B1 | * | 11/2013 | Phillips | H05K 7/1489 361/724 |
| 9,326,386 B2 | * | 4/2016 | Elison | H05K 3/32 |
| 9,456,517 B2 | | 9/2016 | Laufer et al. | |

(Continued)

*Primary Examiner* — Xanthia C Cunningham
(74) *Attorney, Agent, or Firm* — Cindy Kaplan

(57) ABSTRACT

In one embodiment, and apparatus includes a frame comprising a top wall, a bottom wall, and sides defining an opening for receiving a plurality of removable electronic modules, and at least two slidably removable guides extending generally parallel with the sides of the frame, two of the guides each comprising a first edge for slidable engagement with the top wall or the bottom wall and a second edge for slidable engagement with another of the at least two guides. The guides partition the opening for receiving the plurality of removable electronic modules when the guides are inserted into the frame. One or more of the guides may be removed from the frame for receiving a larger width electronic module in the frame.

20 Claims, 11 Drawing Sheets

(56) References Cited

U.S. PATENT DOCUMENTS

| | | | | |
|---|---|---|---|---|
| 2002/0006026 A1* | 1/2002 | Takahashi | ............ | H05K 7/1418 361/679.46 |
| 2002/0131257 A1* | 9/2002 | Agard | .................. | H05K 7/1425 361/796 |
| 2006/0044775 A1* | 3/2006 | Hoshino | .............. | H05K 7/1418 361/796 |
| 2008/0037218 A1* | 2/2008 | Sharma | ................ | H05K 7/1424 361/695 |
| 2013/0050955 A1* | 2/2013 | Shinsato | ................ | G06F 1/181 361/727 |
| 2016/0291645 A1* | 10/2016 | Alvarado | ................ | G06F 1/183 |
| 2017/0055702 A1* | 3/2017 | Sklansky | ............... | A47B 97/00 |

* cited by examiner

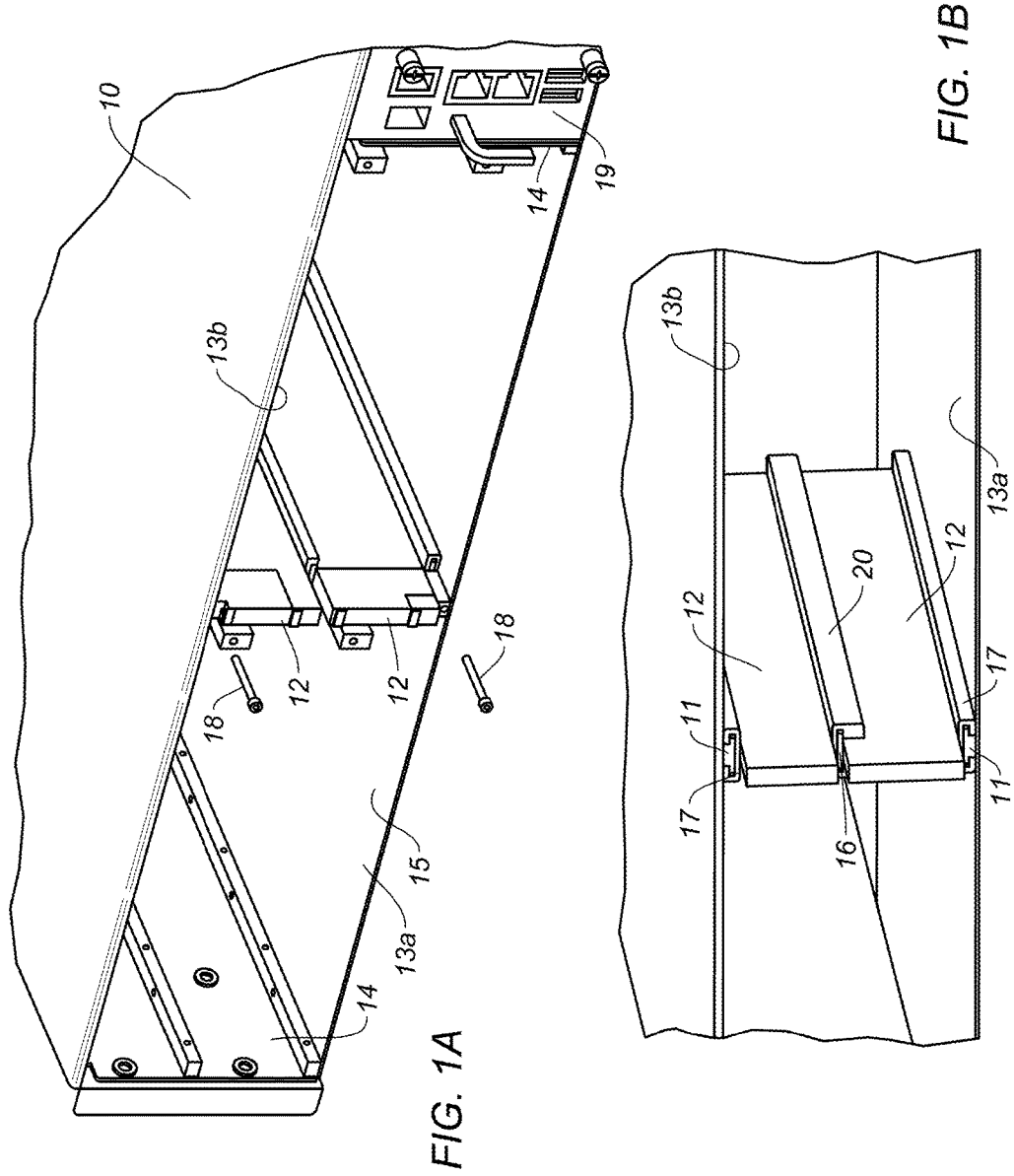

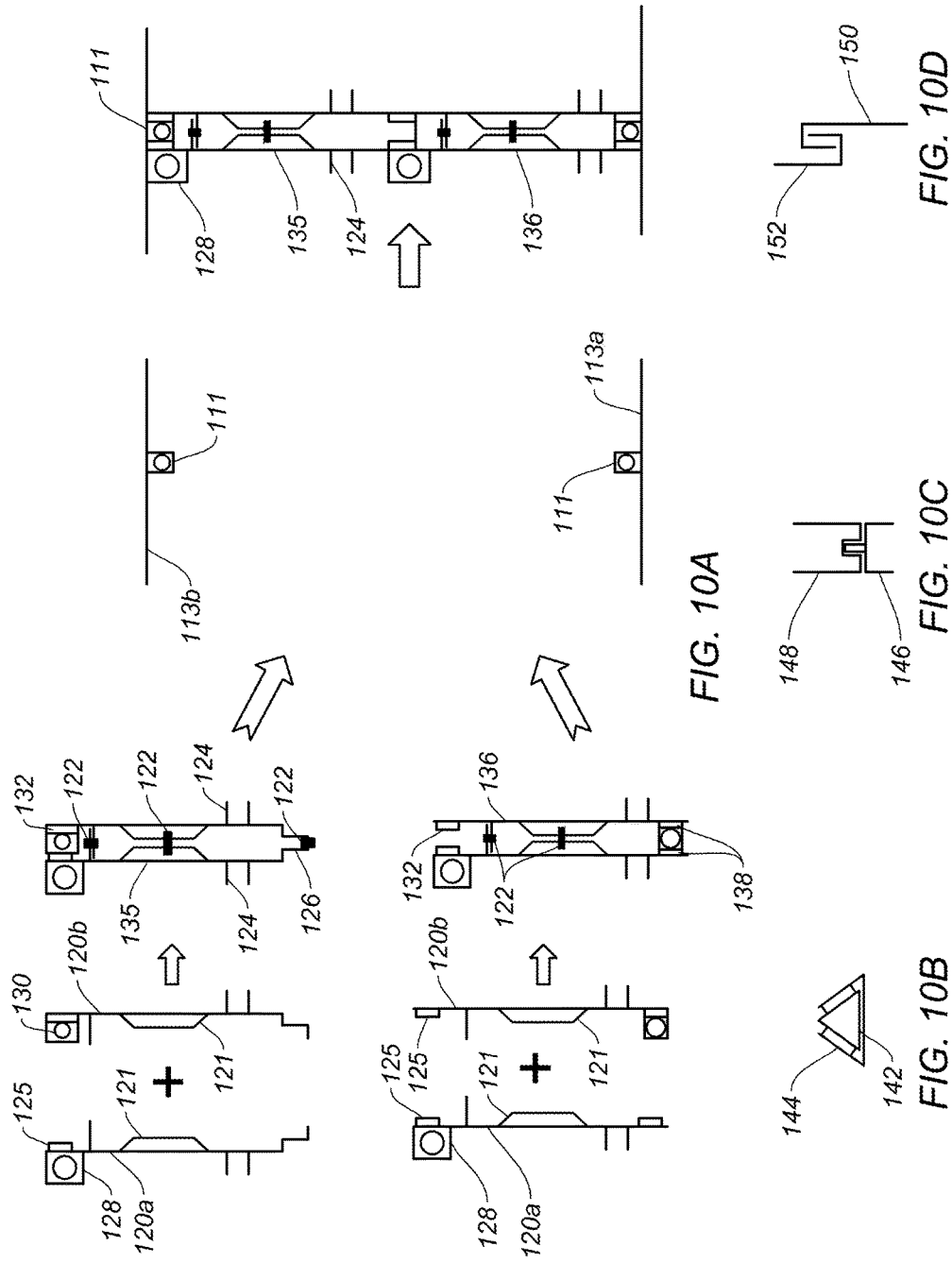

US 10,042,396 B1

CONFIGURABLE MODULE GUIDES FOR MODULAR ELECTRONIC SYSTEM

TECHNICAL FIELD

The present disclosure relates generally to modular electronic systems, and more particularly, configurable module guides for modular electronic systems.

BACKGROUND

Modular electronic systems are designed to provide flexibility to configure systems as per user needs. These systems typically have multiple slots to accommodate a variety of modules (e.g., line cards, service cards, fabric cards, and the like). Conventional modular systems often do not allow for multiple combinations of hardware configurations or future development of field replaceable modules with a different form-factor.

BRIEF DESCRIPTION OF THE DRAWINGS

FIG. 1A is a perspective partial view of a modular electronic system frame with configurable module guides, in accordance with one embodiment.

FIG. 1B is a perspective partial view of the frame and configurable module guides of FIG. 1A with parts removed to show details of sliding engagement of the guides and frame.

FIG. 10A is a front exploded view and assembled view of guides and frame in accordance with another embodiment.

FIG. 10B is a front partial view of sliding engagement of guides, in accordance with one embodiment.

FIG. 10C is a front partial view of sliding engagement of guides, in accordance with another embodiment.

FIG. 10D is a front partial view of sliding engagement of guides, in accordance with yet another embodiment.

Corresponding reference characters indicate corresponding parts throughout the several views of the drawings.

DESCRIPTION OF EXAMPLE EMBODIMENTS

Overview

Figure 2A:
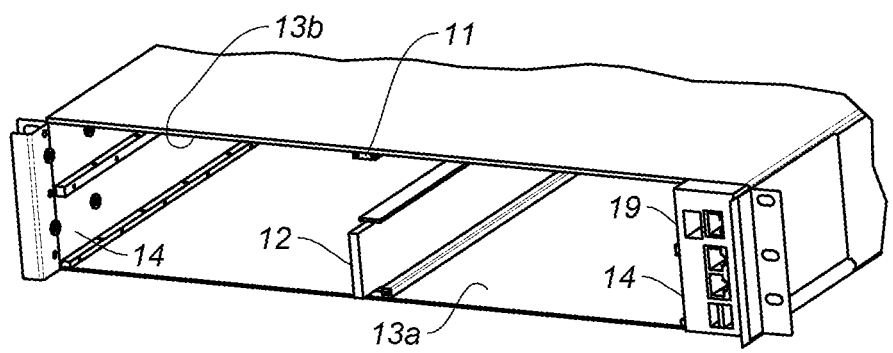
FIG. 2A is a perspective partial view of the frame of FIG. 1B with a top guide removed.

In one embodiment, an apparatus generally comprises a frame comprising a top wall, a bottom wall, and sides defining an opening for receiving a plurality of removable electronic modules, and at least two slidably removable guides extending generally parallel with the sides of the frame, two of the guides each comprising a first edge for slidable engagement with the top wall or the bottom wall and a second edge for slidable engagement with another of the at least two guides. The guides partition the opening for receiving the plurality of removable electronic modules when the guides are inserted into the frame. One or more of the guides may be removed from the frame for receiving a larger width electronic module in the frame.

In another embodiment, an apparatus generally comprises a frame comprising a top wall, a bottom wall, and sides defining an opening for receiving removable electronic modules, a slidably removable guide extending longitudinally in the frame to partition at least a portion of the opening when inserted into the frame, and a plurality of detents located on one of the bottom wall and the top wall and receivable in corresponding grooves in an edge of the guide.

In yet another embodiment, an apparatus generally comprises a plurality of removable electronic modules, a frame comprising a top wall, a bottom wall, and sides defining an opening for receiving the plurality of removable electronic modules, and at least two slidably removable guides extending generally parallel with the sides of the frame, two of the guides each comprising a first edge for slidable engagement with the top wall or the bottom wall and a second edge for slidable engagement with another of the at least two guides. Each of the two guides comprises two mating members defining a channel at one end thereof for receiving a flange on one of the other guides of the frame. The guides partition the opening for receiving the plurality of removable electronic modules when the guides are inserted into the frame.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, or other cards, components, or modules). A drawback with conventional systems is that modules (e.g., cards) typically have to be identical in form factor, so that they can be installed in predefined modular slot configurations. This creates a challenge for future growth as next-generation modules may need additional PCBA (Printed Circuit Board Assembly) area for new devices, more front panel space for higher bandwidth interconnects, and more volume for higher power/thermal dissipation. Due to this limitation, modular electronic systems often reach their end of life within a short period of time and new hardware systems need to be developed.

The embodiments described herein provide a mechanical arrangement for modular platforms, which offers flexibility in configuring module (card) guides to accommodate modules of different form-factors. The field-configurable module guide partitioning system provides a stable mechanical structure that can be used for multiple combinations of field-replaceable modules. As described below, the module slots may be converted into multiple slot configurations by removing the module guides independently from one another.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise a modular electronic system as described herein. The network device may include one or more processor, memory, and network interfaces. One or more of these components may be located in a module (e.g., line card) removably inserted into the network device. The network device may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

One or more embodiments may be used, for example, in high-speed optical transport, DWDM (Dense Wavelength Division Multiplexing), multi-node controller applications, or any other application. As described below, the configurable guide system provides flexibility to accommodate modules for different applications, which may have different hardware requirements, resulting in a different physical form-factor. The variable slot dimensions (width and height) provided by the field configurable module guide partitioning system provides flexibility to accommodate different physical form-factors.

Referring now to the drawings, and first to FIGS. 1A and 1B, a configurable module guide system is shown installed in a chassis frame 10. The configurable module guide system comprises two or more stacked guides (blocks) 12 (e.g., lower (bottom) guide and upper (top) guide). The frame 10 comprises a bottom wall 13a, top wall 13b, and sides 14, which define an opening (slot, cavity, enclosure) 15 for receiving one or more modules. It is to be understood that the terms "top" or "upper" and "bottom" or "lower" as used herein are relative to the installed position of the modular electronic system and may also refer to a left or right wall if the modular electronic system is installed in a vertical rather than horizontal position. The chassis frame 10 may be formed from any suitable material including, for example, aluminum, steel, or any other metal, non-metal, or composite material. The guides (blocks) 12 may also be formed from metal or any other suitable material.

The configurable module guides 12 extend longitudinally from a front edge of the frame 10 towards a rear portion of the frame and may be located at any distance between opposing internal edges 14 of the frame. For example, as shown in FIGS. 1A and 1B, the guides 12 are located parallel to the sides and generally equidistant from each of the internal edges 14 of the frame. The guides 12 may also be positioned at a different distance from each side 14 to provide openings for receiving different width line cards or additional guides may be included to provide further partitioning of the opening 15. As described below, the guides 12 are inserted at the location of the corresponding rails 11.

In the example shown in FIG. 1A, a module (e.g., processor card, controller card) 19 is inserted between an outer edge of the frame and side 14 defining the enclosure 15. As described below, the frame 10 may be configured to receive any number of modules in addition to the modules (cards) received in opening 15 formed by internal sides 14, bottom wall 13a, and top wall 13b.

In the example shown in FIGS. 1A and 1B, the opening 15 is partitioned (divided) by the guides 12 to form two openings (slots, cavities), each defining one or more slots for receiving one or two independent modules. As described in detail below, one (i.e., bottom or top) or both (i.e., bottom and top) guides 12 may be removed from the frame 10 to form different shape and size slots within the opening 15 defined by the bottom and top walls 13a, 13b and sides 14 of the frame 10.

As shown in FIG. 1B, each guide 12 is slidably received on rails 11 connected to (e.g., integral with or attached to) the frame 10 and slidably connected to one another. In the example of FIG. 1B, each of the configurable module guides 12 independently slide over one another and over slide rail features 11 on inner surfaces of the bottom wall 13a and top wall 13b. In one embodiment, each guide 12 includes a U-shaped channel 17 on a first (outer) edge, which is configured to slide over the rail 11 on the bottom or top wall 13a, 13b of the frame 10.

In one embodiment, the bottom guide 12 includes a longitudinal flange 16 on a second (inner) edge, which is slidably received in a channel 20 on a second (inner) edge of the top guide. It is to be understood that the sliding interfaces described herein are only examples and that other configurations may be used without departing from the scope of the embodiments. Also, if the system includes more than two configurable guides 12 (e.g., for taller frames configured to receive more modules or modules with a larger height), guides interposed between the top and bottom guides would have edges suitable for interface with adjacent guides (e.g., flange 16 on one longitudinal edge and channel 20 on other longitudinal edge).

In the embodiment shown in FIG. 1A, the guides 12 are held in place by fasteners 18 extending through the guides 12 and frame 10, as described further below with respect to FIG. 11A.

Figure 2B:
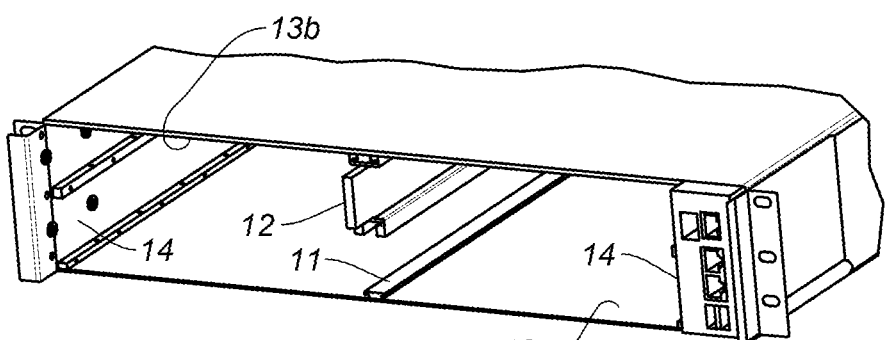
FIG. 2B is a perspective partial view of the frame of FIG. 1B with a bottom guide removed.
Figure 2C:
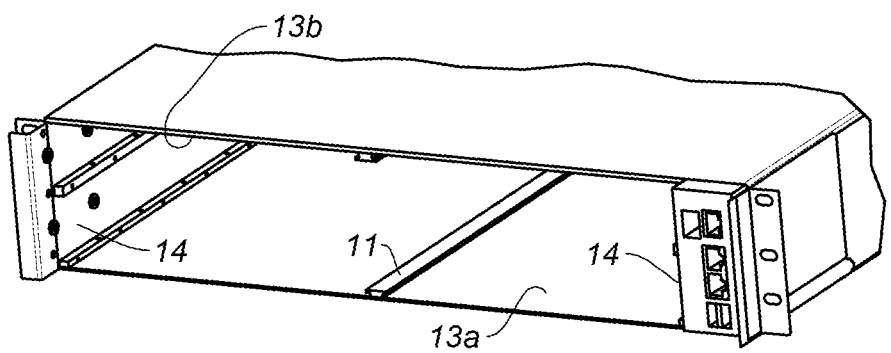
FIG. 2C is a perspective partial view of the frame of FIG. 1B with the top and bottom guides removed.
Figure 7:
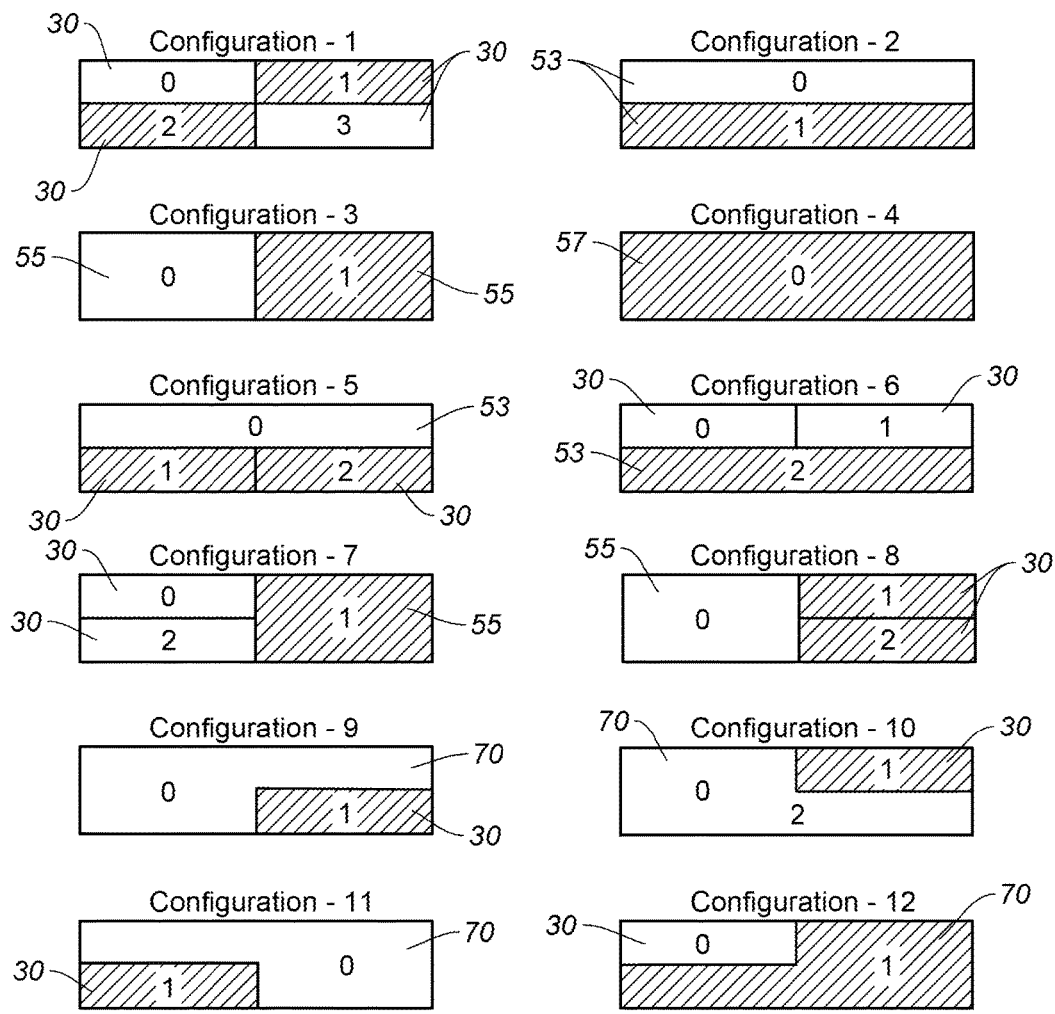
FIG. 7 schematically illustrates different module configurations that may be installed with the configurable module guides.

As shown in FIGS. 2A, 2B, and 2C, one or both of the guides 12 may be independently removed from the frame 10 to configure the modular electronic system for receiving various numbers or sizes of modules. FIG. 2A shows the bottom guide 12 installed with the top guide removed. Once the top guide is removed, a full-width module may be installed in the upper portion of the frame 10 with two half-width modules installed in the lower portion of the frame. FIG. 2B shows the bottom guide 12 removed to allow for a full-width module to be installed in the lower portion of the frame. FIG. 2C shows both guides 12 removed to allow for a full-width, full-height module or two full width, half-height modules to be installed in the frame. A half-width, full-height module may also be installed with both guides 12 in place. Also, an L-shaped module may be installed along with a half-width, half-height module with one guide 12 installed, as shown in FIG. 7 and described below.

It is to be understood that terms herein referring to width (or wide) and height (or high) are relative to the orientation of the modular electronic system shown in the Figures and may also refer to corresponding dimensions if the modular electronic system is installed vertically rather than horizontally. In one or more embodiments, the width of the line card is greater than the height of the line card. Also, the terms "half" or "full" as used herein are relative to the number of guides 12 installed in the frame 10 and the height of the frame. For example, if the frame is configured to receive three stacked guides, a line card that is referred to herein as half-height may be one-third height and a line card referred to herein as full-height may be two-thirds height.

Figure 3:
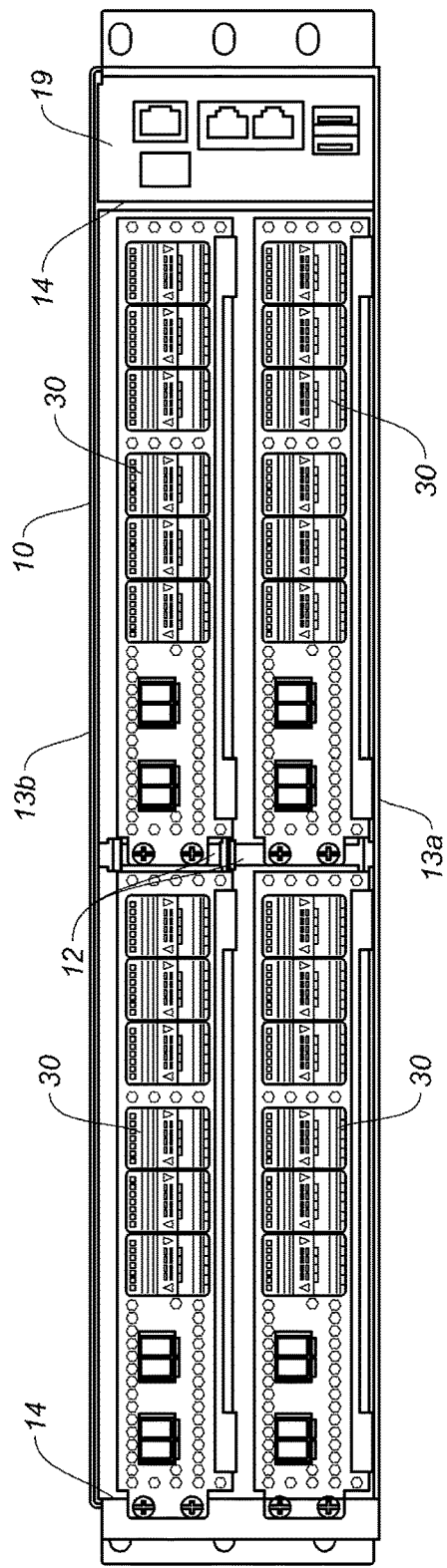
FIG. 3 is a front view of the frame and guides of FIG. 1A with modules installed.

FIG. 3 is a front view of a modular electronic system with four half-width, half-height independent line cards 30 installed along with one controller card 19. The modular electronic system may operate, for example, as a switch, router, server, or any other network device comprising modules (components, cards, trays, elements) included in modular sections. The modules 19, 30 and guides 12 are slidably removable from the frame 10. The line cards 30 and controller card 19 may comprise any number of interfaces or components, as is well known by those skilled in the art. The line card 30 may comprise, for example, a printed circuit board assembly. As previously noted and described in detail below, one or more guides 12 may be removed to allow for different form-factor modules. Also, with both guides 12 installed, a half-width, full height line card may be installed in one or both openings (slots) formed by the guides 12, walls 13a, 13b, and sides 14. Thus, different height modules may be installed without removing the guides 12.

Figure 4A:
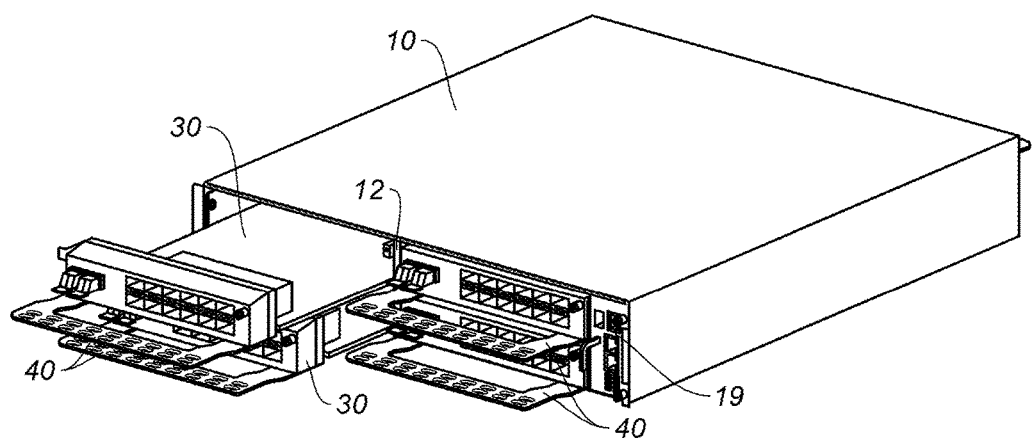
FIG. 4A is a front perspective of the modular electronic system of FIG. 3.
Figure 4B:
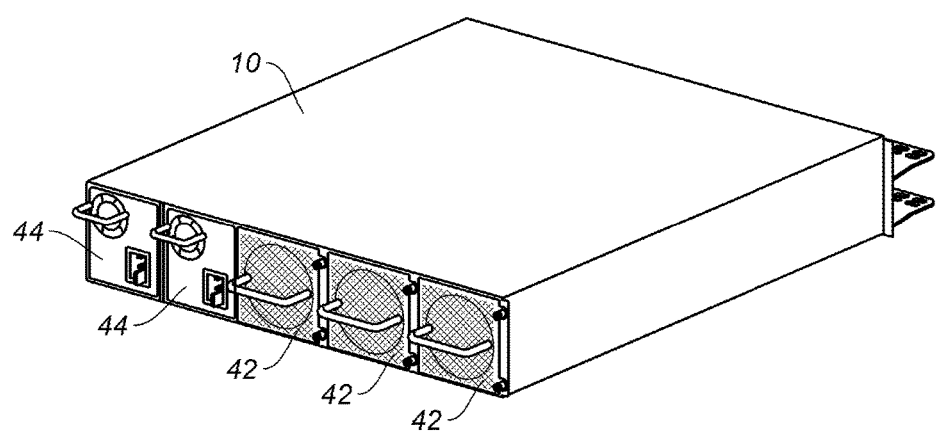
FIG. 4B is a rear perspective of the modular electronic system of FIG. 3.

FIGS. 4A and 4B are front and rear perspective views of the modular electronic system shown in FIG. 3. In this example, the system includes two guides 12 installed in the frame 10 configured for receiving four line cards 30. The controller card 19 is also installed in a front of the system. The system may include one or more doors 40 movable between an open position (as shown in FIG. 4A) for installing or removing the line cards 30 and a closed position, in which the doors 40 at least partially cover the line cards. As shown in FIG. 4B, the modular electronic system in this example further includes three modular fan trays 42 for circulating air throughout the chassis and preventing the cards 30 from overheating, and two modular power supply units 44.

It is to be understood that the configuration shown in FIGS. 3, 4A, and 4B is only an example and that the modular electronic system may be configured for receiving any number or type of modules, including, for example, power components, air outlet, air inlet, fan trays, fiber management components, cards (e.g., fabric card, line card, service card, combo card, controller card, processor card, high density line card, high power line card, high density and power line card). The electronic modular system may include any type, number, shape, size, or arrangement of components and modules, without departing from the scope of the embodiments. Also, the modular electronic system may be configured with any number, size, shape, or arrangement of guides 12.

Figure 5:
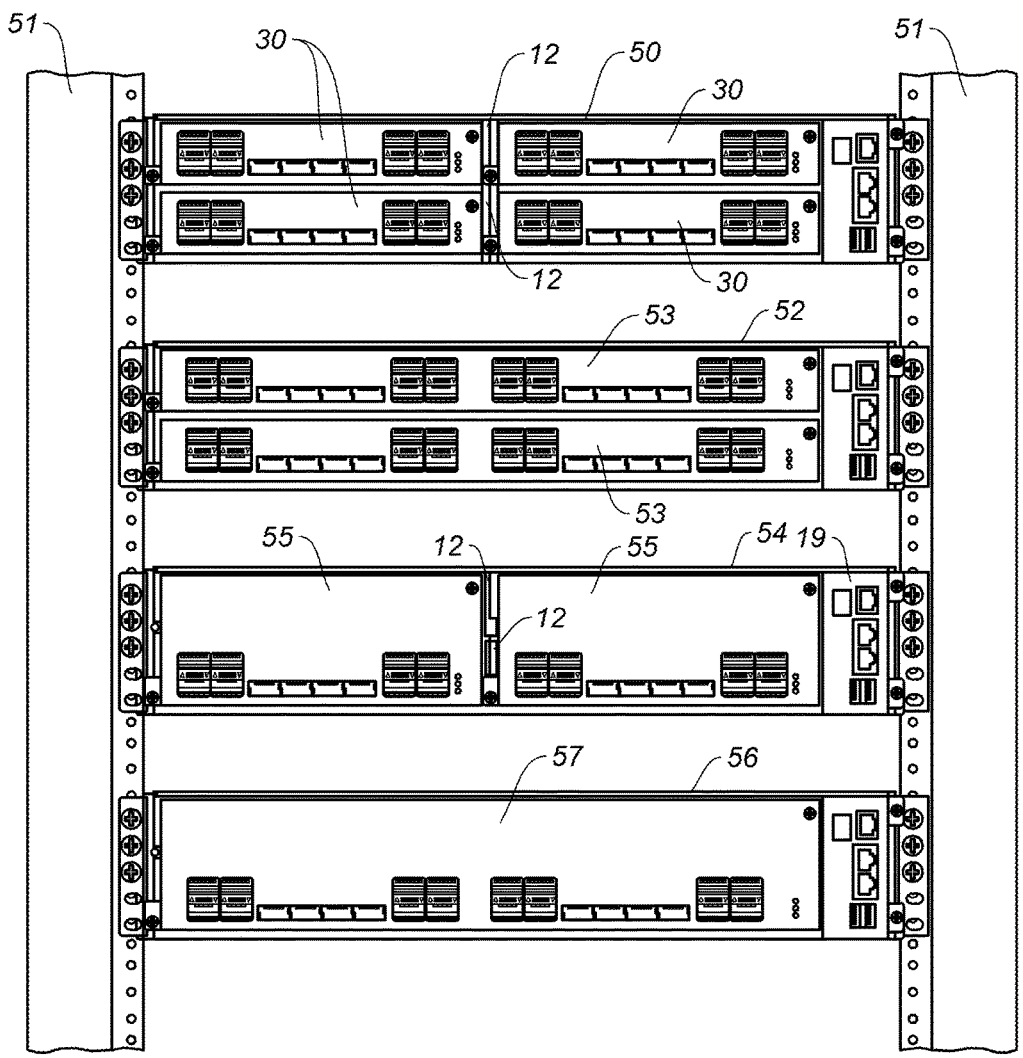
FIG. 5 is a front view showing different configurations of the guides and modules in modular electronic systems mounted in a rack mounting system.

In one embodiment, the modular electronic system is mounted in a rack mounting system (e.g., two or four post rack mounting system with slider brackets). FIG. 5 is a front view of a rack mounting system with four modular electronic systems mounted on brackets 51. In this example, the top system 50 comprises two guides 12 configured to hold four line cards 30, the second system 52 (moving downward) has both guides removed and includes two full-width, half-height line cards 53. The third system 54 has two guides 12 installed and includes two half-width, full-height line cards 55. The bottom system 56 has no guides installed and comprises one full-width, full-height line card 57.

Figure 6:
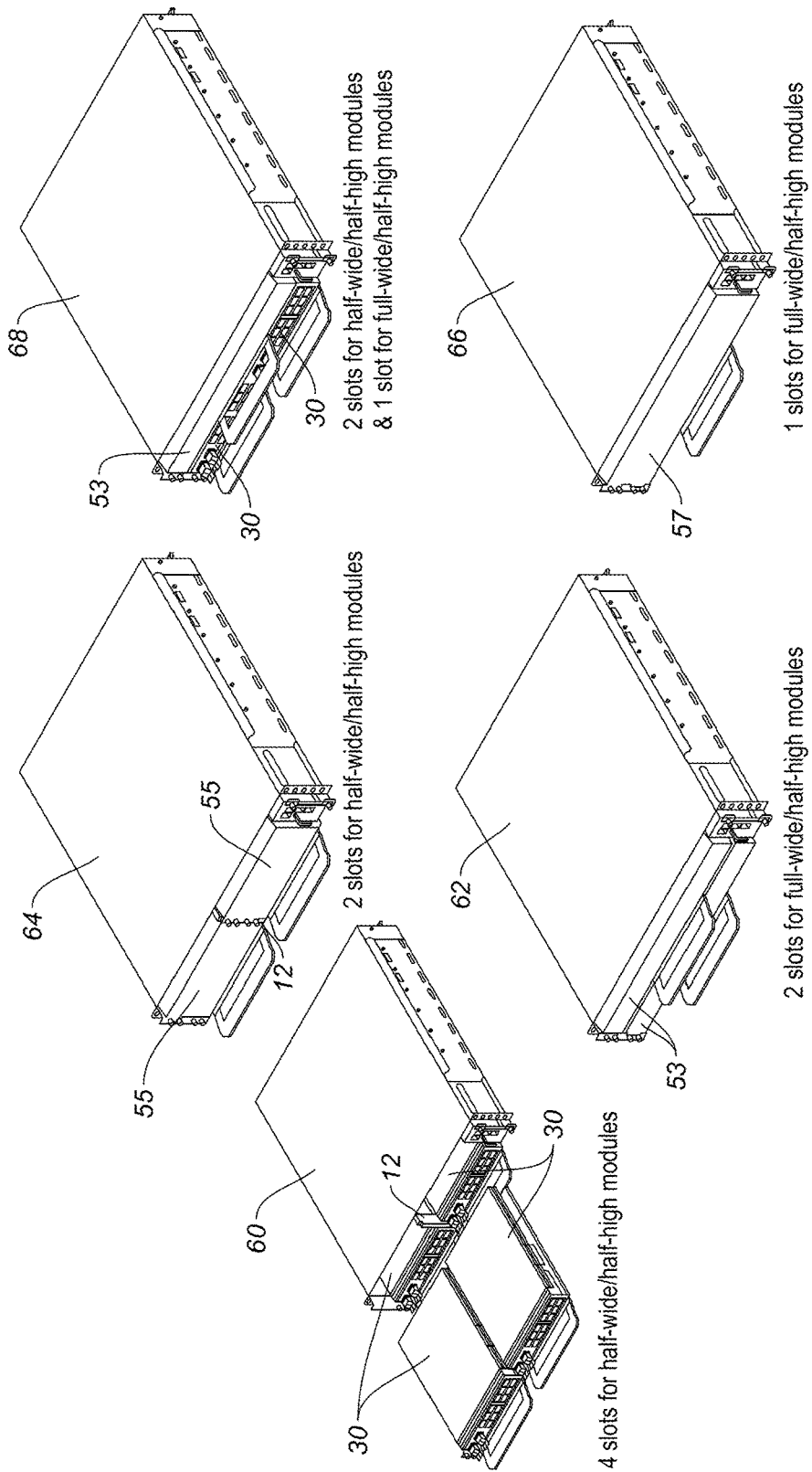
FIG. 6 shows perspective views of modular electronic systems with different configurations of guides and modules.

FIG. 6 shows different configurations of modular electronic systems with configurable module guides 12. A first system 60 comprises two guides 12 with four half-width, half-height cards 30 (corresponding to system 50 in FIG. 5). System 62 has no guides installed and holds two full-width, half-height line cards 53 (corresponding to system 52 in FIG. 5). System 64 includes two guides 12 and two half-width, full-height line cards 55 (corresponding to system 54 in FIG. 5). System 66 has no guides installed and holds one full-width, full-height line card 57 (corresponding to system 56 in FIG. 5). System 68 has one guide 12, two half-width, half-height line cards 30, and a full-width, half-height line card 53.

FIG. 7 schematically illustrates various configurations that may be formed with the two removable module guides 12 and different shape and size modules (labeled 0, 1, 2, 3). Configurations 1, 2, 3, 4, and 5 in FIG. 7 correspond to systems 60, 62, 64, 66, and 68 in FIG. 6, respectively. Configuration 6 is similar to configuration 5, expect that the full-width module 53 is on the bottom and the half-width modules 30 are on top. Configuration 5 has a guide 12 on the lower portion, whereas configuration 6 has the guide on the upper portion. Configurations 7 and 8 include two guides for supporting one half-width, full-height module 55 and two half-width, half-height modules 30. Configurations 9, 10, 11, and 12 each include one half-width, half-height module 30 and one irregular shaped (L-shaped) module 70.

In one example, module 70 may comprise a line card on one side (generally corresponding in shape to a standard half-height, half-width line card) attached to a heat sink. The L-shaped form factor of module 70 provides an optimized volume for high power components to provide a bigger heat sink and also provides additional front panel area to add interconnects that can offer higher system bandwidth. These non-standard modules 70, when used with standard modules 30 offer a unique combination of system functionality.

It is to be understood that the configurable module guide system described herein and the configurations shown in FIGS. 1A-7 are only examples and that the system may be scaled up to different sizes and types of hardware platforms and comprise any number of guides 12, without departing from the scope of the embodiments. For example, three or more guides may be stacked within an opening to provide a wide variety of configurations for various module form-factors or combinations of modules. Also, there may be two or more rows of stacked guides placed parallel to one another to further partition the opening for receiving different width line cards.

Figure 8:
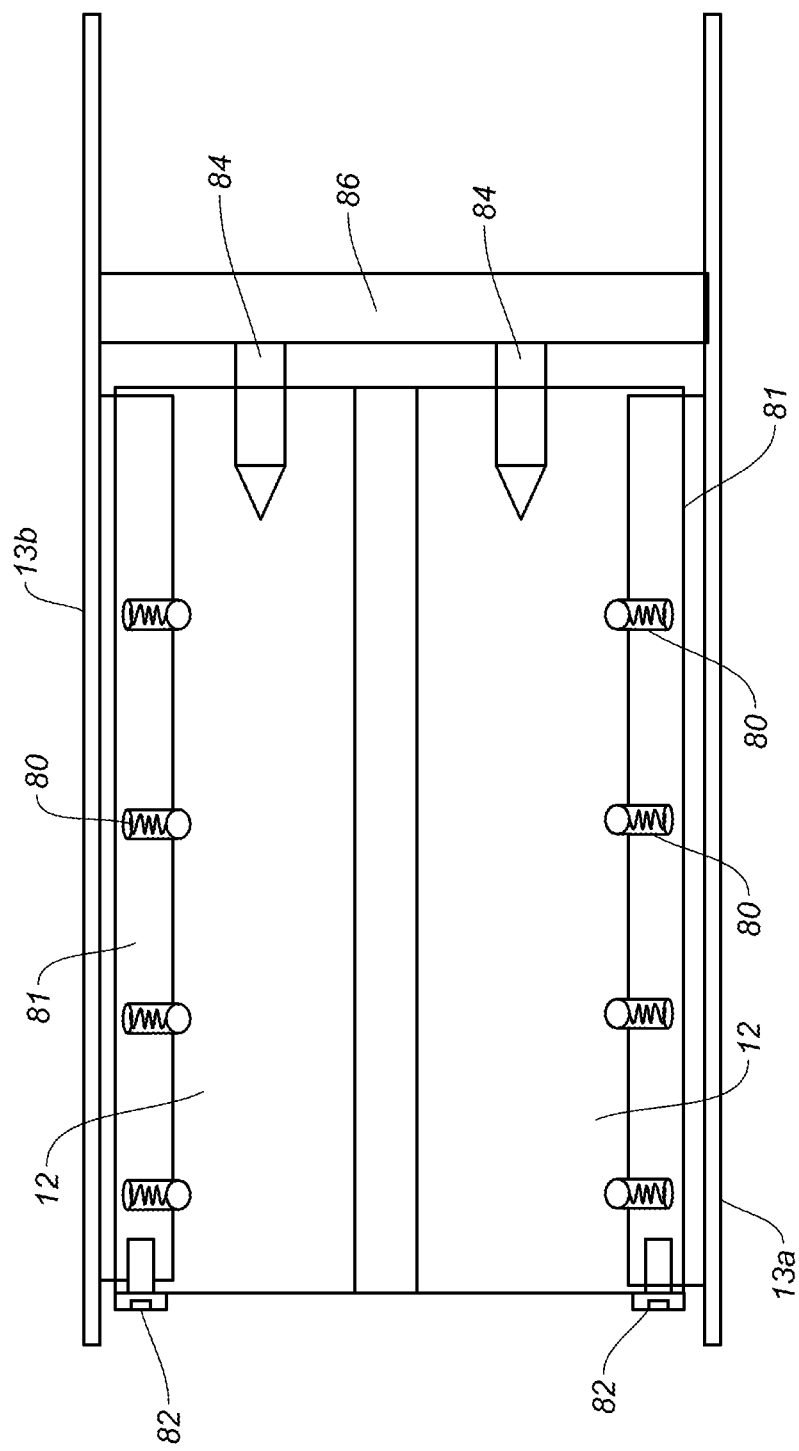
FIG. 8 is a cross-sectional side view of the configurable module guides and frame shown in FIG. 1A with a detent mechanism, in accordance with one embodiment.

FIG. 8 is a cross-sectional side view of the guides 12 in frame 10. In one embodiment, the guides 12 are easily removed upon removing captive screws 82 at a front portion of the frame. The captive screws 82 are fastened on the fixed rails 81 attached to the bottom and top 13a, 13b of the frame 10. As described in detail below with respect to FIGS. 11A and 11B, the screws 82 may be designed with safety features to prevent unintended removal of the guides 12 or removal of the guides while the line cards are installed.

In one or more embodiments, mechanical guide pins 84 are attached to a vertical support column 86 extending between the lower and upper portions 13*a*, 13*b* of the frame 10. The guides 12 are aligned and supported by the index pins 84, which provide stability to the structure during extreme conditions of shock and vibration.

In one embodiment, each of the guides 12 is configured to interface with a detent mechanism comprising one or more detents 80 located on rails 81 on the lower and/or upper portions of the frame 10. The detents 80 provide positive contact between the guide 12 and frame 10 and maintain consistent insertion and extraction forces. They may also be used for indexing to ensure that the guides 12 are assembled properly within the frame 10 and relative to one another. In one or more embodiments, the detent 80 provides a spring force to provide mechanical stability and also compensate for minor tolerance variations.

Figure 9:
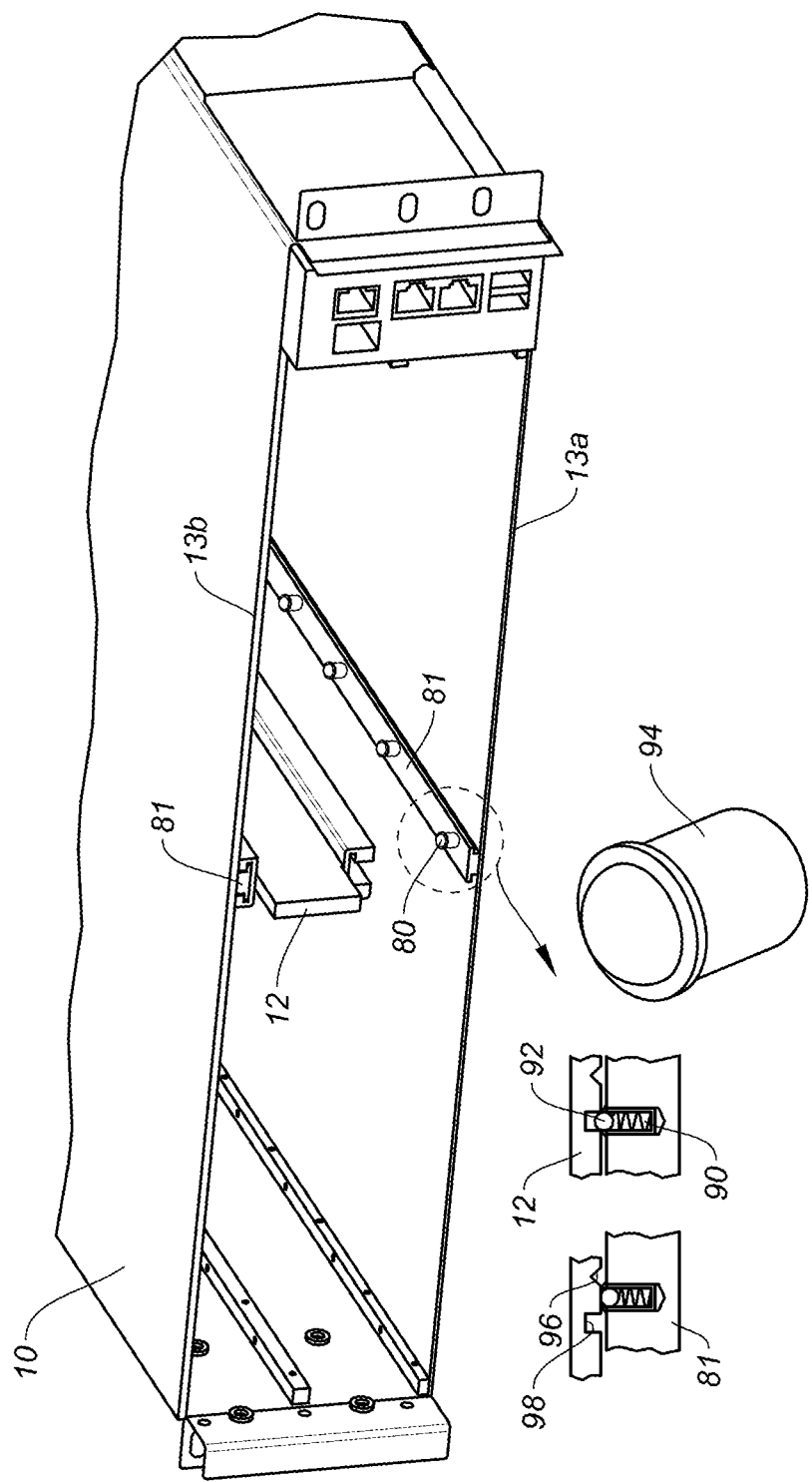
FIG. 9 is a perspective partial view of the frame and guide of FIG. 2B with an exploded view showing details of the detent mechanism, in accordance with one embodiment.

FIG. 9 illustrates additional details of one embodiment of a detent mechanism. The detent 80 comprises a spring 90 and ball 92 forming a plunger retained in a housing 94. The spring loaded ball 92 automatically depresses to allow for adjustments. The guide 12 comprises corresponding ramped grooves 96. When the groove 96 slides over the detent as the guide 12 slides relative to the frame 10 and rail 81, the spring loaded ball 92 snaps into the groove. A last groove 98 on the guide 12 may be formed in a different cross-sectional shape, as shown in the exploded view in FIG. 9, to provide an indexing feature to snap the guide into its proper alignment and position. The force of the detent 80 is easily overcome with a small force when the guide 12 is removed from the frame 10.

FIG. 10A illustrates a guide and frame assembly, in accordance with another embodiment. As described above with respect to FIGS. 1A and 1B, the embodiment comprises two removable guides slidably engaged with one another and a frame. As shown in the assembled view (right portion of FIG. 10A), two guides 135, 136 are slidably engaged with lower and upper walls 113*a*, 113*b* of a frame in a modular electronic system. Each guide 135, 136 comprises two mating members 120*a*, 120*b* (shown in the exploded view on the left portion of FIG. 10A). The two members 120*a*, 120*b* are connected to create the guide 135, 136. In one example, each member is formed from a low cost material (e.g., sheet-metal, plastic, composite, or any other material). In one or more embodiments, an inner portion of each member 120*a*, 120*b* comprises an inwardly facing rib 121. In the example shown in FIG. 10A, the members are riveted together (or connected by other suitable means) at three (or fewer or more) locations including the ribs 121 and upper and lower portions, as indicated at 122. Each member 120*a*, 120*b* further comprises outwardly extending fingers 124 providing a groove for interface with line cards or other modules.

An upper portion of the top guide 135 and a lower portion of the bottom guide 136 are shaped to define fingers 138 forming a channel 132 for receiving a flange 111 extending from the walls 113*a*, 113*b* of the frame for sliding engagement therewith. An opposite end of one of the guides (bottom guide 136 in the example of FIG. 10A) also comprises fingers forming a channel 132 for receiving a mating portion 126 of the other guide (top guide in FIG. 10A). The channel 132 on the upper and lower portions of the guides 135, 136 is located behind the mounting block 130 configured to mate with mounting block on the flange 111 for receiving a connector (e.g., screw), as described below with respect to FIG. 11A. A mounting block 128 is also provided for the line cards. The guides 135, 136 and rails 111 extend longitudinally reward in the opening formed in the frame, as previously described with respect to FIGS. 1A and 1B. As described above, there may be any number of stacked guides located at any position within the frame to partition the opening for receiving any number, shape, size, or combination of modules.

In one embodiment, one or more EMI finger (gasket, foam) 125 may be attached to one or more members 120*a*, 120*b* to help with conductive contact between parts and to ensure proper sliding friction between parts.

There are multiple configurations that may be used for sliding engagement between the guides 135, 136 and between the guides and frame. FIGS. 10B, 10C, and 10D illustrate a few examples. In FIG. 10B one end of a member 142 has a generally triangle shaped cross-section and is configured to slidably engage with a corresponding shaped grove 144. In FIG. 10C, one end of the member 148 comprises a narrow channel for receiving a finger extending from an end of a mating member 146. In the example shown in FIG. 10D, generally u-shaped members 150, 152, slidably engage with one another.

It is to be understood that the shapes, sizes, cross-sections, and arrangement of the guides, and guides and frames shown in FIGS. 10A-10D are only examples and that other configurations may be used without departing from the scope of the embodiments.

Figure 11A:
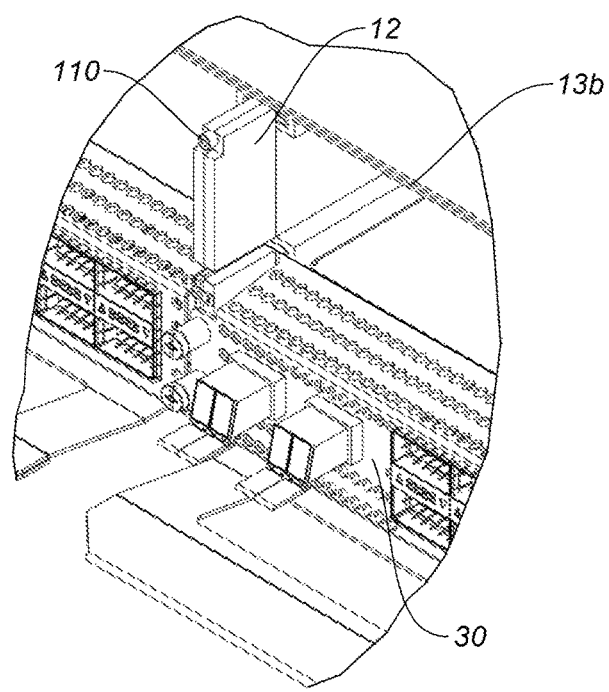
FIG. 11A is a perspective partial view illustrating guide fasteners, in accordance with one embodiment.
Figure 11B:
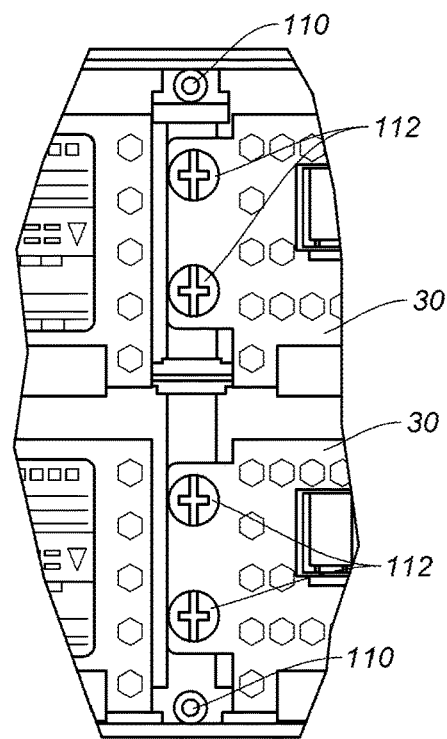
FIG. 11B is a front view illustrating module fasteners, in accordance with one embodiment.

FIGS. 11A and 11B illustrate one embodiment of fastening screws for the guides 12 and modules 30, respectively. The guides 12 may be retained in the frame 10 with fasteners (e.g., captive screws) 110 (FIG. 11A) and the line cards 30 connected to the guides 12 with fasteners (e.g., screws) 112 (FIG. 11B). The screws 110 are inserted into openings in the guides 12 and rails 11 (FIGS. 1A and 11A). The screws 112 are inserted into openings on the line cards 30 and guides 12. In one embodiment, the heads of the guide screws 110 are shaped differently from the line card screws 112 so that a different tool is needed to remove the guides 12, thereby preventing inadvertent removal of the guides. Also, the screws 110 may be positioned such that they are not accessible with the line cards 30 installed.

As can be observed from the foregoing, the embodiments described herein may provide numerous advantages. For example, one or more embodiments enable flexible modularity by allowing for combinations of different form-factor modules supporting a variety of business applications (switching, routing, transport, computing, security, and others). Since only new modules need to be developed, rather than modules and frame, hardware development investment may be reduced and longer product life cycles may be achieved. One or more embodiments provide increased flexibility for next-generation modules with more PCB (Printed Circuit Board) area and higher density of interconnects. A combination of high and low power modules provides an optimum use of available volume. Irregular shaped form-factors (e.g., L-shaped) provide larger volume for heat sink along with multiple front panel interconnect ports. One or more embodiments offer opportunity for future development of higher performance modules, reduce development time, increase product life cycle, and provide a common hardware system for multiple business segments. By allowing customers to use the same hardware for modules of different functionality, their capital investment may be reduced. One or more embodiments may also provide improved mechanical stability, consistent insertion/extraction forces, and compensation for tolerance variations through the use of a detent mechanism between the guides and frame. Indexing may also be provided to ensure proper alignment between the guides and frame. One or more embodiments may also provide safety features that prevent inadvertent removal of the configurable module guides or modules from being inserted in wrong orientation.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
a frame comprising a top wall, a bottom wall, and sides defining an opening for receiving a plurality of removable electronic modules; and
at least two slidably removable guides extending generally parallel with the sides of the frame, two of the guides each comprising a first edge for slidable engagement with the top wall or the bottom wall and a second edge for slidable engagement with another of said at least two guides;
wherein the guides partition said opening for receiving said plurality of removable electronic modules when the guides are inserted into the frame and wherein one or more of the guides may be removed from the frame for receiving a larger width electronic module in the frame.

2. The apparatus of claim 1 wherein the frame is configured to receive different height modules without changing the number of guides installed in the frame.

3. The apparatus of claim 1 further comprising an L-shaped module inserted into the opening with one of the guides removed from the frame.

4. The apparatus of claim 1 wherein the top wall and the bottom wall each comprise a rail configured to slide within a longitudinal groove on said first end of the two guides.

5. The apparatus of claim 1 wherein the guides extend longitudinally generally equidistant from the sides of the frame defining said opening.

6. The apparatus of claim 1 wherein said second edge of one of the guides comprises a channel for receiving a flange on said second edge of another of the guides.

7. The apparatus of claim 1 wherein at least one of the top and bottom walls comprises a plurality of detents receivable in corresponding grooves in said first edge of one of the guides.

8. The apparatus of claim 1 wherein the detent comprises a spring and ball.

9. The apparatus of claim 1 wherein each of the guides comprise two mating members, the mating members defining a channel at one end thereof for receiving a flange on one of the other guides or the frame.

10. An apparatus comprising:
a frame comprising a top wall, a bottom wall, and sides defining an opening for receiving removable electronic modules;
at least two slidably removable guides extending generally parallel with the sides of the frame, two of the guides each comprising a first edge for slidable engagement with the top wall or the bottom wall and a second edge for slidable engagement with another of said at least two guides; and
a plurality of detents located on one of the bottom wall and the top wall and receivable in corresponding grooves in an edge of the guide.

11. The apparatus of claim 10 wherein the detent comprises a spring and ball.

12. The apparatus of claim 10 wherein the electronic modules comprise line cards and the apparatus is configured to receive a different number of the line cards based on a number of guides removed from the frame and a height of the line cards.

13. The apparatus of claim 10 wherein at least one of the top wall and the bottom wall comprises a rail for slidable interface with a longitudinal groove on a first end of the guide.

14. The apparatus of claim 10 wherein the guide extends longitudinally generally equidistant from the sides of the frame defining said opening.

15. The apparatus of claim 10 wherein a second edge of the guide comprises a channel for receiving a flange on an edge of an adjacent guide.

16. The apparatus of claim 10 further comprising a plurality of stacked guides configured to partition the entire opening when inserted into the frame.

17. An apparatus comprising:
a plurality of removable electronic modules;
a frame comprising a top wall, a bottom wall, and sides defining an opening for receiving said plurality of removable electronic modules; and
at least two slidably removable guides extending generally parallel with the sides of the frame, two of the guides each comprising a first edge for slidable engagement with the top wall or the bottom wall and a second edge for slidable engagement with another of said at least two guides;
wherein each of the two guides comprises two mating members defining a channel at one end thereof for receiving a flange on one of the other guides or the frame; and
wherein the guides partition said opening for receiving said plurality of removable electronic modules when the guides are inserted into the frame.

18. The apparatus of claim 17 wherein the electronic modules comprise at least two line cards each having a different width or height than the other line card.

19. The apparatus of claim 17 wherein said at least two guides comprises two guides dividing said opening into two openings, each of said openings configured to receive one line card or two line cards having a height generally half of the height of the one line card, each of the line cards comprising the same width.

20. The apparatus of claim 17 wherein the channel comprises a pad to provide a specified sliding friction between the guides.

* * * * *